US012648237B2

(12) United States Patent
Wu et al.

(10) Patent No.: US 12,648,237 B2
(45) Date of Patent: Jun. 2, 2026

(54) SOLAR CELL MODULE

(71) Applicant: Industrial Technology Research Institute, Hsinchu (TW)

(72) Inventors: Hsin-Chung Wu, Hsinchu County (TW); Chun-Wei Su, Hsinchu County (TW); Tzu-Ting Lin, New Taipei City (TW); En-Yu Pan, Hsinchu County (TW); Yu-Tsung Chiu, Taipei City (TW); Chih-Lung Lin, Hsinchu City (TW); Teng-Yu Wang, Hsinchu City (TW); Chiou-Chu Lai, Hsinchu County (TW); Ying-Jung Chiang, Hsinchu City (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 18/818,614

(22) Filed: Aug. 29, 2024

(65) Prior Publication Data

US 2025/0081632 A1 Mar. 6, 2025

Related U.S. Application Data

(60) Provisional application No. 63/535,309, filed on Aug. 30, 2023.

(51) Int. Cl.
*H10F 19/80* (2025.01)
*H10F 77/60* (2025.01)
(52) U.S. Cl.
CPC .......... *H10F 19/807* (2025.01); *H10F 77/60* (2025.01)
(58) Field of Classification Search
CPC ......... H10F 19/807; H10F 77/60; Y02E 10/50
See application file for complete search history.

(56) References Cited

U.S. PATENT DOCUMENTS 11,355,660 B2 6/2022 Li et al.
2010/0031997 A1 2/2010 Basol
(Continued)

FOREIGN PATENT DOCUMENTS

CN 103608928 1/2016
CN 209344091 9/2019
(Continued)

OTHER PUBLICATIONS

Machine translation of CN-213601883-U, Tan, Xiao-chun. (Year: 2021).*
(Continued)

*Primary Examiner* — Mayla Gonzalez Ramos
(74) *Attorney, Agent, or Firm* — JCIPRNET

(57) ABSTRACT

A solar cell module includes a first substrate, a second substrate, at least one cell unit, a first packaging film, a second packaging film, a first protective layer, a second protective layer, and a plurality of support members. The first substrate and the second substrate are disposed opposite to each other. The cell unit is disposed between the first substrate and the second substrate. The first packaging film is disposed between the cell unit and the first substrate. The second packaging film is disposed between the cell unit and the second substrate. The first protective layer is disposed between the cell unit and the first packaging film. The second protective layer is disposed between the cell unit and the second packaging film. The support members are respectively disposed between the first packaging film and the second packaging film and surround at least two opposite sides of the cell unit.

15 Claims, 10 Drawing Sheets

(56) References Cited

U.S. PATENT DOCUMENTS

| | | | |
|---|---|---|---|
| 2014/0020735 A1 | 1/2014 | Watanabe et al. | |
| 2016/0240712 A1 | 8/2016 | Hahn et al. | |
| 2020/0266311 A1 | 8/2020 | Chan | |
| 2021/0202770 A1 | 7/2021 | Kuan et al. | |
| 2024/0363770 A1* | 10/2024 | Tao | H10F 19/85 |

FOREIGN PATENT DOCUMENTS

| | | | |
|---|---|---|---|
| CN | 112566785 | | 3/2021 |
| CN | 213601883 U | * | 7/2021 |
| CN | 116314409 | | 6/2023 |
| TW | 201320439 | | 5/2013 |
| TW | 201435282 | | 9/2014 |
| TW | 201541656 | | 11/2015 |
| TW | 201642574 | | 12/2016 |
| TW | 1637589 | | 10/2018 |
| TW | 201900998 | | 1/2019 |
| TW | 202126486 | | 7/2021 |
| TW | 202131620 | | 8/2021 |

OTHER PUBLICATIONS

"Search Report of Europe Counterpart Application", issued on Jan. 29, 2025, p. 1-p. 8.
"Office Action of Taiwan Counterpart Application", issued on May 26, 2025, p. 1-p. 6.

* cited by examiner 100
106
110
104
114b
114a
112
108
102

Z
Y
X

400

104

S2

S1

300

CA

L d1

1

100/102

Y

X

500

104

S1

S2

302 d2

CA

100/102

Y

X

600

104

304

S1

S2

CA

306

304

100/102

Y

X

Tinned copper strip      Chip

Support member

SOLAR CELL MODULE

CROSS-REFERENCE TO RELATED APPLICATION

This application claims the priority benefit of U.S. provisional application Ser. No. 63/535,309, filed on Aug. 30, 2023. The entirety of the above-mentioned patent application is hereby incorporated by reference herein and made a part of this specification.

TECHNICAL FIELD

The disclosure relates to a solar cell module conducive to recycling.

BACKGROUND

With the development of science and technology, humans have improved their quality of life and accelerated the consumption of earth's energy. Therefore, the demand for alternative energy sources is increasing day by day, making the production and research of solar energy devices the most popular topic at present. At the same time, with the production and replacement of a large number of solar energy devices, these devices need to be recycled and reused.

However, during the thermal disassembly process of recycling double-sided glass solar modules, it is difficult to effectively relieve pressure after the adhesive material is liquefied or vaporized. At the same time, the downward pressure of the upper glass, pressed down by its own weight, and the stress and the impact between the hard materials result in significant cracking of glass and cell chips, so that effective recycling may not be achieved.

SUMMARY

The disclosure provides a solar cell module that may alleviate the issue of significant cracking of a substrate and a cell chip during thermal disassembly.

A solar cell module of the disclosure includes a first substrate, a second substrate, at least one cell unit, a first packaging film, a second packaging film, a first protective layer, a second protective layer, and a plurality of support members. The first substrate and the second substrate are disposed opposite to each other. The cell unit is disposed between the first substrate and the second substrate. The first packaging film is disposed between the cell unit and the first substrate, and the second packaging film is disposed between the cell unit and the second substrate. The first protective layer is disposed between the cell unit and the first packaging film, and the second protective layer is disposed between the cell unit and the second packaging film. The plurality of support members are respectively disposed between the first packaging film and the second packaging film and surround at least two opposite sides of the cell unit.

Based on the above, in the disclosure, the structural design may reduce the cracking of the substrate and the cell chip after the thermal disassembly process, thereby effectively recycling the glass substrate and increasing chip recycling rate.

In order to make the aforementioned features and advantages of the disclosure more comprehensible, embodiments accompanied with figures are described in detail below.

DETAILED DESCRIPTION OF DISCLOSED EMBODIMENTS

Figure 1:
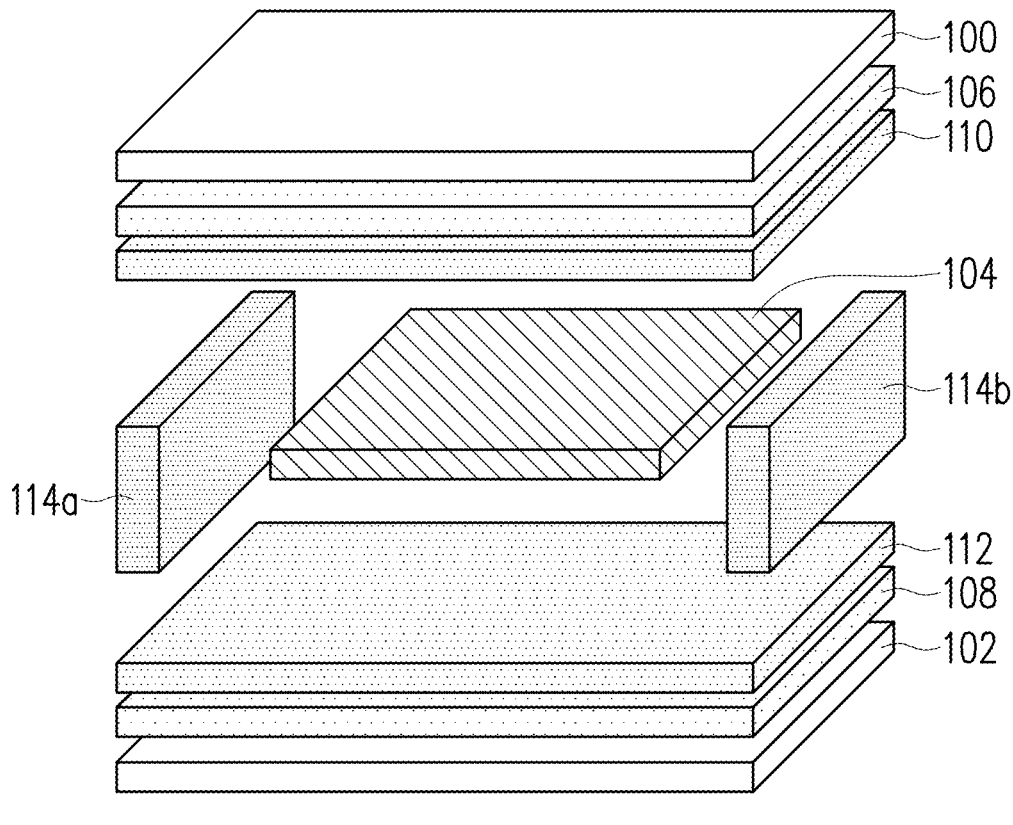
FIG. 1 is a three-dimensional exploded view of a solar cell module according to an embodiment of the disclosure.
Figure 1:
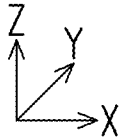

Embodiments are provided hereinafter and described in detail with reference to figures. However, the embodiments provided are not intended to limit the scope of the disclosure. In addition, the drawings are for illustration purposes and are not drawn to original scale. In order to facilitate understanding, the same elements are described with the same reference numerals in the following description.

FIG. 1 is a three-dimensional exploded view of a solar cell module according to an embodiment of the disclosure.

Referring to FIG. 1, a solar cell module includes a first substrate 100, a second substrate 102, at least one cell unit 104, a first packaging film 106, a second packaging film 108, a first protective layer 110, a second protective layer 112, and a plurality of support members 114a and 114b. The first substrate 100 and the second substrate 102 are disposed opposite to each other, and the first substrate 100 and the second substrate 102 may be glass or other suitable substrate materials. The cell unit 104 is disposed between the first substrate 100 and the second substrate 102. Although one cell unit 104 is shown in the figure, it should be noted that a solar cell module usually includes a plurality of cell units 104 that are electrically connected. The first packaging film 106 is disposed between the cell unit 104 and the first substrate 100, and the second packaging film 108 is disposed between the cell unit 104 and the second substrate 102. In some embodiments, the first packaging film 106 and the second packaging film 108 include a thermosetting resin. In some embodiments, the first packaging film 106 and the second packaging film 108 may further contain an additive, such as a hardening initiator, an antioxidant, a cross-linking agent, a stabilizer, and the like.

In FIG. 1, the plurality of support members 114a and 114b are respectively disposed between the first packaging film 106 and the second packaging film 108 and surround at least two opposite sides of the cell unit 104, and FIG. 1 shows the support members 114a and 114b in an emphasized and enlarged manner, the size (such as height) of the support members 114a and 114b is actually less than the first packaging film 106 and the second packaging film 108. From the perspective of adapting to the temperature of the thermal disassembly process, the support members 114a and 114b may adopt a ceramic material having a heat-resistant temperature greater than 400° C. and a coefficient of thermal expansion (CTE) less than 10 ppm/° C. In some embodiments, the material of the support members 114a and 114b is, for example, low-temperature co-fired ceramic (LTCC) or other suitable ceramic materials, wherein the low-temperature co-fired ceramic may include, but is not limited to, glass ceramic, crystallized glass, alumina, or zirconia. Due to the presence of the support members 114a and 114b, the cracks of the first substrate 100, the second substrate 102, and the cell units 104 (chips) in the solar cell module is significantly reduced after the thermal disassembly process. In addition to the cuboid shown in the figure, the structure of the support members 114a and 114b may also be a cylinder, a hexagonal cylinder, a sphere, etc.

Referring further to FIG. 1, the first protective layer 110 is disposed between the cell unit 104 and the first packaging film 106, and the second protective layer 112 is disposed between the cell unit 104 and the second packaging film 108. The first protective layer 110 and the second protective layer 112 include a thermoplastic resin or partially cross-linked polymer, wherein the partially cross-linked polymer refers to a polymer having a cross-linking degree of 50% or less, for example, a polymer having a cross-linking degree of 5%, 10%, 15%, 20%, 25%, 30%, 35%, 40%, 45%, or 50%. In some embodiments, the polymer may be selected from polyethylene, polypropylene, ethylene-vinyl acetate copolymer (EVA), ethylene-vinyl acetate rubber (EVM), ethylene-acrylic acid copolymer (EAA), ethylene-methacrylic acid copolymer (EMAA), ethylene-methyl acrylate copolymer (EMA), ethylene-ethyl acrylate copolymer (EEA), ethylene-butyl acrylate copolymer (EBA), propylene-ethyl methacrylate copolymer, propylene-ethyl acrylate copolymer, epoxy resin, polyolefin resin, polyurethane resin, diblock resin, tri-block resin, or a combination of the above. The partially cross-linked polymer may also contain a cross-linking agent and other additives, such as an initiator, an antioxidant, a stabilizer, etc. In some embodiments, the thicknesses of the first protective layer 110 and the second protective layer 112 are respectively between 100 μm and 350 μm. In some embodiments, a lower cross-linking degree may be associated with a smaller thickness; and a higher cross-linking degree may be associated with a larger thickness. In some embodiments, the first protective layer 110 and the second protective layer 112 have the effect of protecting the cell unit 104 during the thermal disassembly process.

Figure 2:
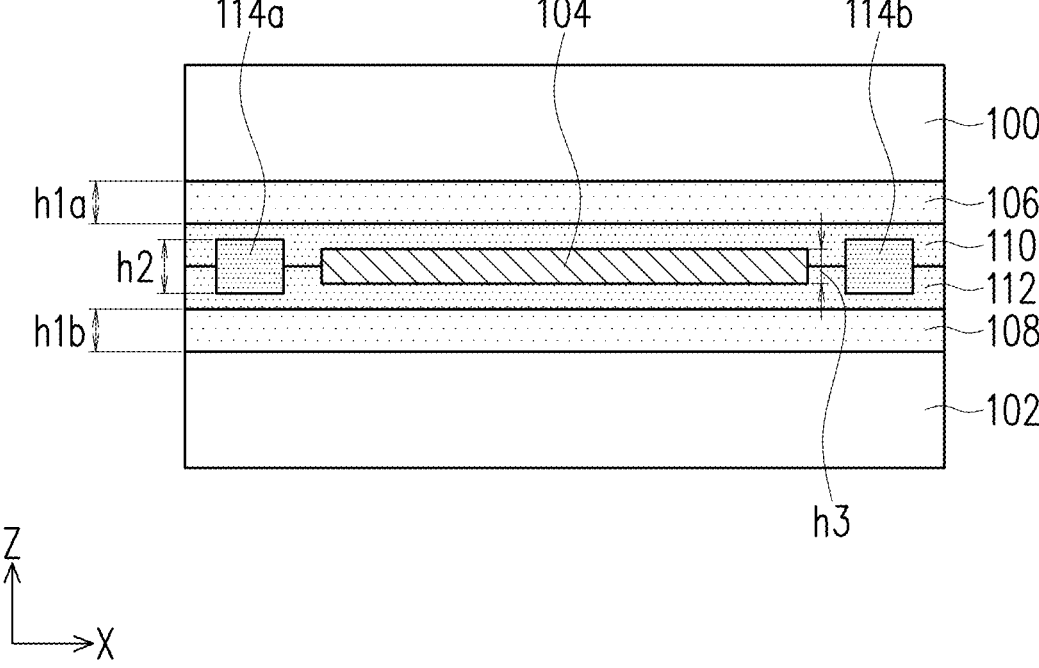
FIG. 2 is a schematic cross-sectional view of a solar cell module according to another embodiment of the disclosure.

FIG. 2 is a schematic cross-sectional view of the solar cell module of FIG. 1 after packaging, wherein the same or similar portions, structures, or dimensional definitions are represented using the same reference numerals as in FIG. 1, and for descriptions of the same portions, structures, or size definitions, please refer to the relevant descriptions of FIG. 1 which are not be repeated here.

In FIG. 2, the first protective layer 110 is in direct contact with the cell unit 104 and the support members 114a and 114b, one side of the first packaging film 106 is in contact with the first protective layer 110, and another side of the first packaging film 106 is in contact with the first substrate 100. In other words, the first packaging film 106 is not in direct contact with the cell unit 104. The second protective layer 112 is in direct contact with the cell unit 104 and the support members 114a and 114b, one side of the second packaging film 108 is in contact with the second protective layer 112, and another side of the second packaging film 108 is in contact with the second substrate 102. In other words, the second packaging film 108 is not in direct contact with the cell unit 104. In some embodiments, the sum of a thickness h1a of the first packaging film 106 and a thickness h1b of the second packaging film 108 is greater than a height h2 of the support member 114a, and the height h2 of the support member 114a is greater than a height h3 of the cell unit 104.

Figure 3A:
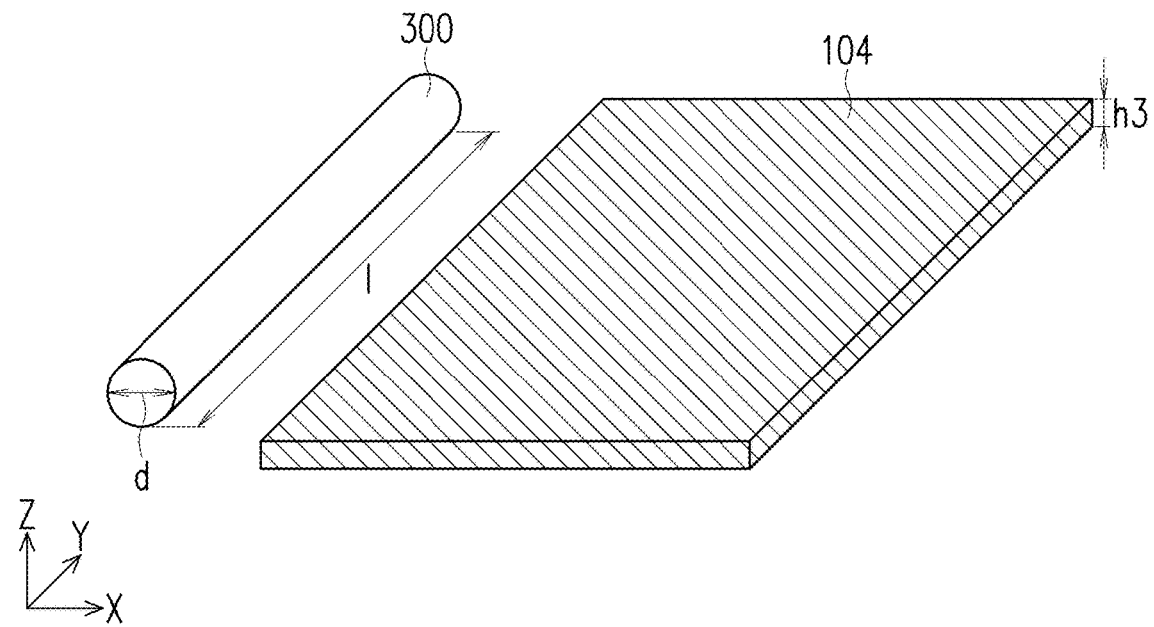
FIG. 3A is a positional relationship diagram between a support member and a cell unit of the disclosure.

FIG. 3A is a positional relationship diagram between a support member 300 and the cell unit 104 of the disclosure. In FIG. 3A, the support member 300 is a cylinder, and a diameter d of the cylinder is less than the total thickness (i.e., the value of the thickness h1a plus the thickness h1b) of the first packaging film 106 and the second packaging film 108 in FIG. 2A, and the diameter d of the cylinder is greater than the height h3 of the cell unit 104. A length l of the cylinder is not limited and may be less than or equal to the length/width of the cell unit 104. If a sphere is used as the support member, the diameter thereof may be as provided for the diameter d of the cylinder. If a hexagonal cylinder is adopted as a support member, the hexagonal cross-sectional area thereof may be determined by referencing the circular cross-sectional area of the cylinder, and the length thereof may be as provided for the length l of the cylinder.

Figure 3B:
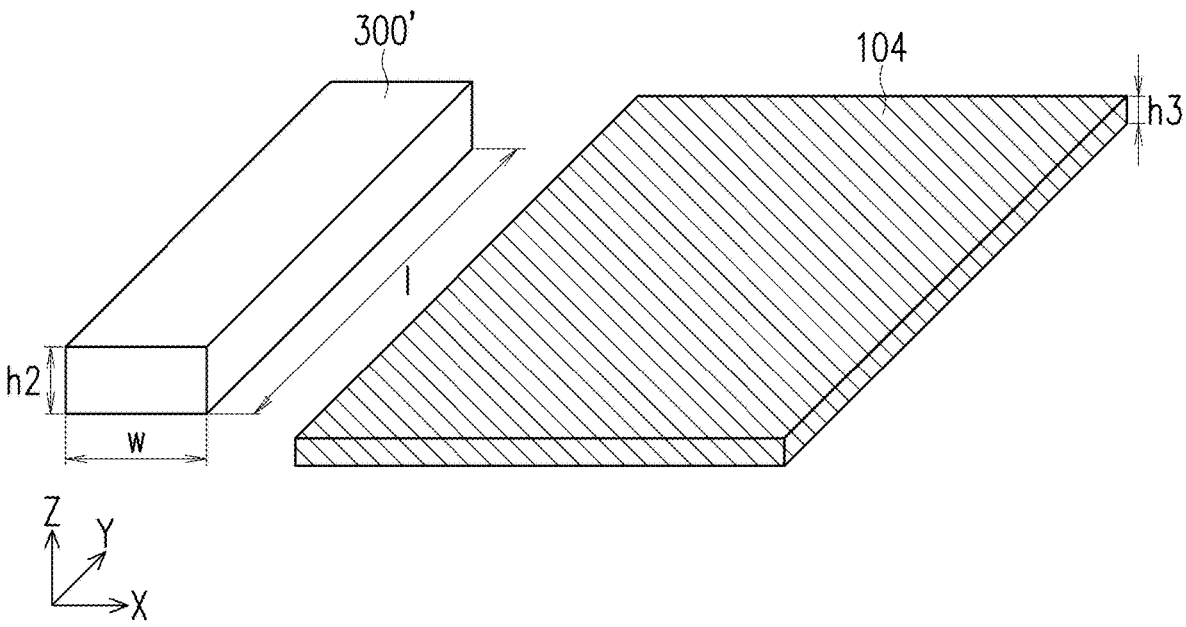
FIG. 3B is a positional relationship diagram between another support member and a cell unit of the disclosure.

FIG. 3B is a positional relationship diagram between another support member 300' and the cell unit 104 of the disclosure. In FIG. 3B, the support member 300' is a cuboid, and the height h2 of the cuboid is less than the total thickness (that is, the value of the thickness h1a plus the thickness h1b) of the first packaging film 106 and the second packaging film 108 in FIG. 2A, and the height h2 of the cuboid is greater than the height h3 of the cell unit 104. The length l of the cuboid is not limited and may be less than or equal to the length/width of the cell unit 104. A width w of the cuboid is greater than the height h2 of the cuboid, and the upper limit of the width w of the cell unit 104 is determined according to the space that may accommodate a cuboid at the edge of the cell unit 104, for example, 10 mm or less, 5 mm or less, or 4 mm or less.

The following experiments are listed to verify the implementation effect of the disclosure, but the disclosure is not limited to the following content.
1. Simulation Test The software ANSYS mechanical V19 was used to simulate the situation in which a 6×10 full cell module was placed flat in a 400° C. high-temperature furnace cavity, wherein the quantity and the location of the support members were changed, and the solar cell module for subsequent preparation and actual testing was determined according to the simulation results.

In the simulated module structure, two sizes of strengthened tempered glass were adopted. The large size glass was 1033 mm×1675 mm×3.2 mm, and the small size glass was 996 mm×1678 mm×2 mm; the size of the cell unit (silicon chip) was set to 158.75 mm×158.75 mm±0.25 mm, and the height was 160 μm±30 μm; the spacing between cell units was 2 mm to 3 mm, and there were bonding wires (not shown) having a thickness of 120 μm±20 μm. There were two types of simulated support members, one was a cylinder of 0.38 mm in diameter×10 cm in length, and the other was a cylinder of 0.70 mm in diameter×10 cm in length.

Figure 4:
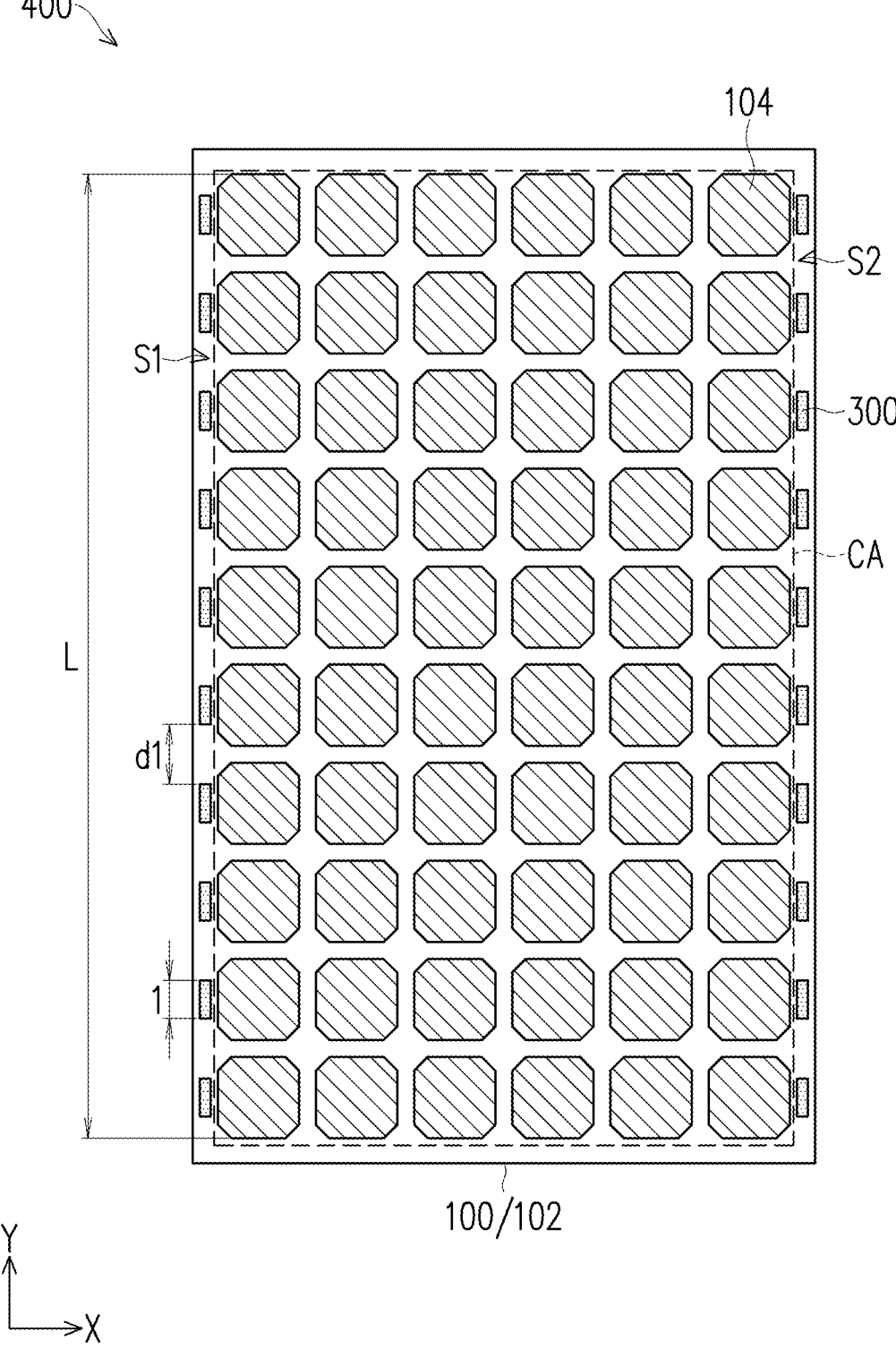
FIG. 4 is a plan view of a first example of a solar cell module in an embodiment of the disclosure.
Figure 5:
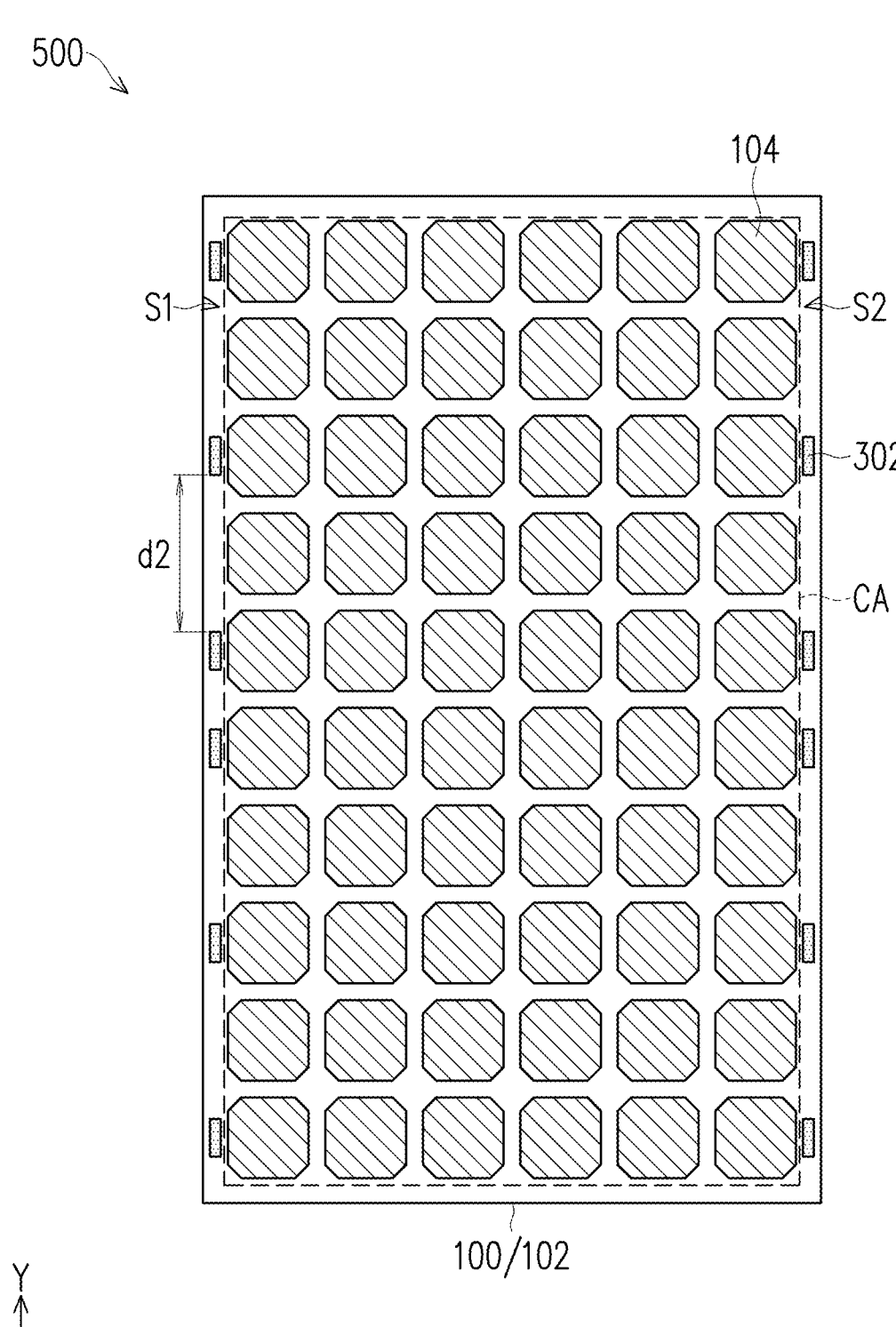
FIG. 5 is a plan view of a second example of a solar cell module in an embodiment of the disclosure.
Figure 6:
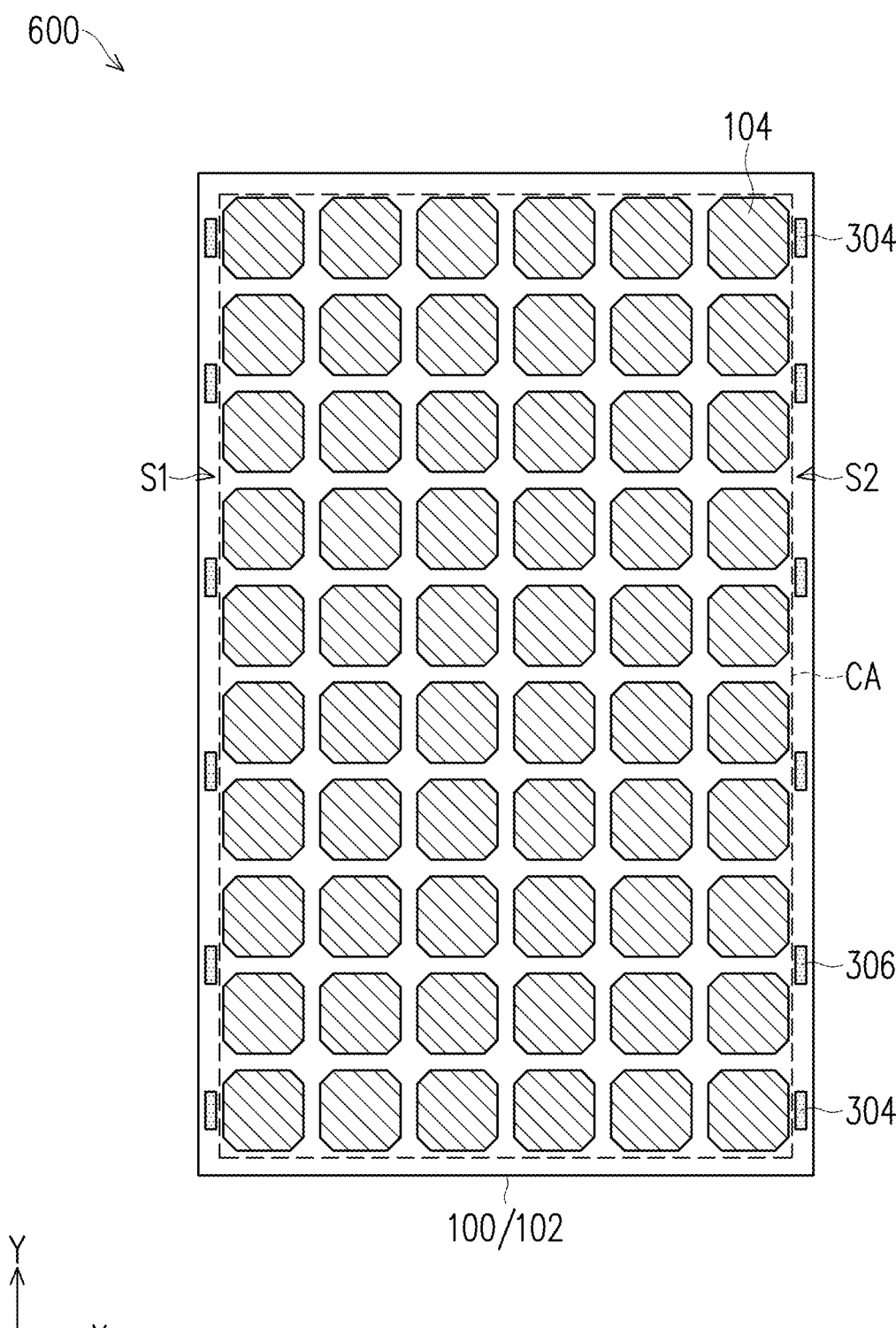
FIG. 6 is a plan view of a third example of a solar cell module in an embodiment of the disclosure.

FIG. 4 to FIG. 6 are plan views of three solar cell modules with excellent simulation results.

In a solar cell module 400 of FIG. 4, the quantity of the cell unit 104 is 60, and 60 cell units form a solar cell array CA. There are 20 of the support members 300 in total that are respectively disposed at the side of each of the cell units 104 in two opposite sides S1 and S2 of the solar cell array CA and aligned with the corresponding cell units 104. That is, each of the support members 300 is aligned with the corresponding cell unit 104 in the X direction. A spacing d1 between the support members 300 is about 0.5 to 1 time the length of the cell units.

The total length of all of the support members 300 of the opposite side S1 of the solar cell array CA of FIG. 4 (the length l times 10 of the support members 300) accounts for approximately 59.6% to 59.7% of a length L of the opposite side S1, but the disclosure is not limited thereto. In some embodiments, if the length l of the support members 300 is 4 cm, the total length of the support members 300 of the opposite side S1 of the solar cell array CA accounts for approximately 23.8% to 23.9% of the length L of the opposite side S1; and so on.

In another embodiment, if the quantity of the support members 300 is changed to 3 and the length l of the support members 300 is 10 cm, the total length of all of the support members 300 of the opposite side S1 of the solar cell array CA accounts for approximately 17.9% of the length L of the opposite side S1. In another embodiment, if the quantity of the support members 300 is changed to 3 and the length l of the support members 300 is 4 cm, the total length of all of the support members 300 of the opposite side S1 of the solar cell array CA accounts for approximately 7.2% of the length L of the opposite side S1. Therefore, in some embodiments of the disclosure, the total length of all of the support members 300 of the opposite side S1 (or the opposite side S2) of the solar cell array CA accounts for approximately 7.2% to 59.7% of the length L of the opposite side S1, but is not limited thereto. In other embodiments, the total length of all of the support members 300 of the opposite side S1 (or the opposite side S2) of the solar cell array CA accounts for approximately 6% to 70% of the length L of the opposite side S1, but is not limited thereto.

In a solar cell module 500 of FIG. 5, the quantity of the cell unit 104 is 60, and 60 cell units form the solar cell array CA. There are 12 of the support members 302 in total that are respectively disposed at the sides of a portion of the plurality of cell units 104 in the two opposite sides S1 and S2 of the solar cell array CA and aligned with the corresponding cell units 104. A spacing d2 between the support members 302 is about 1.5 to 2 times the length of the cell units.

In a solar cell module 600 of FIG. 6, the quantity of the cell unit 104 is 60, and 60 cell units form the solar cell array CA. There are 12 of the support members 304 and 306 in total, wherein the support members 304 are respectively disposed at the top portion and the bottom portion of the two opposite sides S1 and S2 of the solar cell array CA and aligned with the corresponding cell units 104, and the remaining support members 306 are dispersedly disposed at the two opposite sides S1 and S2 of the solar cell array CA. The support member 306 may, for example, be disposed relative to a position between two adjacent cell units 104; or, the spacing between the support member 306 and the support member 304 or the spacing between two adjacent support members 306 is 1.5 to 2 times the side length of the cell units 104 in the Y direction (length direction).

Figure 7:
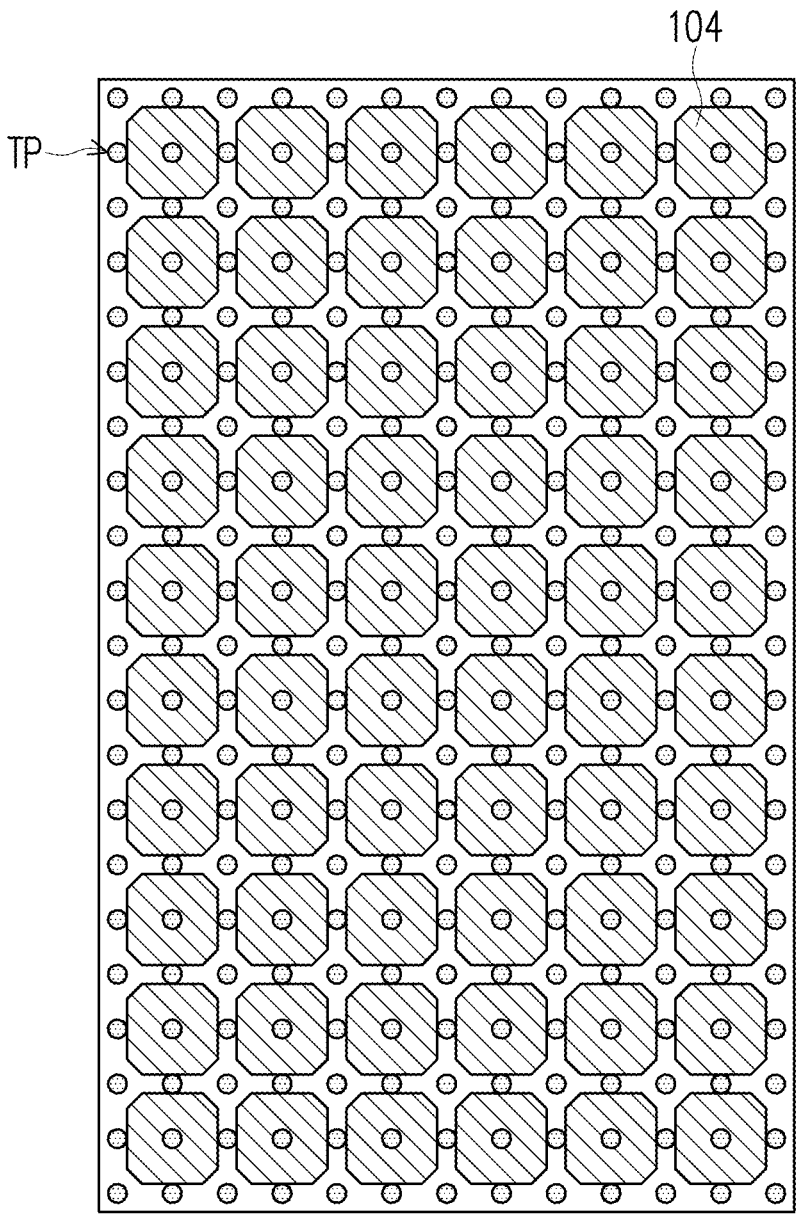
FIG. 7 is a plan view of the solar cell module of the simulation experiment.

FIG. 7 shows the distribution position of a measurement point TP relative to the cell unit 104 in the simulation experiment. The simulation results are shown in Table 1 below.

TABLE 1

| Solar cell module | | FIG. 4 | FIG. 5 | FIG. 6 |
|---|---|---|---|---|
| Quantity of support members | | 20 | 12 | 12 |
| Two pieces of glass | Diameter of support members: 0.38 mm | ○ | Δ | Δ |
| having small dimensions | Diameter of support members: 0.70 mm | ○ | ○ | ○ |
| Two pieces of glass having large dimensions | Diameter of support members: 0.38 mm | ○ | ○ | ○ |
| | Diameter of support members: 0.70 mm | ○ | ○ | ○ |

○ means that after thermal deformation, the residual gap between the two pieces of glass at all measurement points TP was always greater than the predetermined value (the predetermined value of the support members having a diameter of 0.38 mm was 0.30 mm; the predetermined value of the support members having a diameter of 0.70 mm was 0.60 mm).

Δ means that after thermal deformation, the residual gap between the two pieces of glass at the measurement point TP of a small area of the edge was less than the predetermined value. (This means that after thermal deformation, the residual gap between the two pieces of glass at most measurement points TP was greater than the predetermined value)

It may be seen from Table 1 that at least 12 support members were arranged at two opposite sides of the solar cell array to maintain sufficient gaps between the substrates during the thermal disassembly process. Therefore, the solar cell module for testing was designed according to the simulation results.

2. Module Preparation

2.1 Material

Substrate: strengthened tempered glass, width 996 mm, length 1678 mm, height 2 mm. (Product name FMG Sunextra, purchased from Flat Glass Group Co., Ltd.)

Double-layer structure (packaging film and protective layer): total thickness 0.75 mm (ECO-EASY produced by Sanfang Chemical, or reference may be made to the application number TW112108139).

Thermosetting resin: SVECK EVA thickness 0.65 mm (product number SV-15296P, purchased from SVECK TECHNOLOGY).

Cell unit: Chip NS6WL, Mono 5BB, height 0.18 mm (purchased from URECO).

Support member A: LTCC containing zirconia, cuboid having heat resistance≥400° C. and CTE≤10 ppm/° C., height 1.0 mm, width 2.0 mm, length 400 mm.

Support member B: cuboid having heat resistance≥400° C. and CTE≤10 ppm/° C., height 1.3 mm, width 2.0 mm, length 400 mm.

Support member C: cylinder having heat resistance≥400° C. and CTE≤10 ppm/° C., diameter 0.7 mm, length 100 mm.

2.2 Steps

First, a double-layer structure and 60 chips were stacked on a lower substrate, and then different quantities of support members were placed at two opposite sides. Then, the double-layer structure and an upper substrate were stacked in sequence. Refer to the relative positions of each component in FIG. 1. The types of the support members are recited in Table 2 below.

Then, hot pressing was performed, the hot pressing temperature was 140° C. to 160° C., and the time was 15 minutes to 30 minutes.

7

Figure 8:
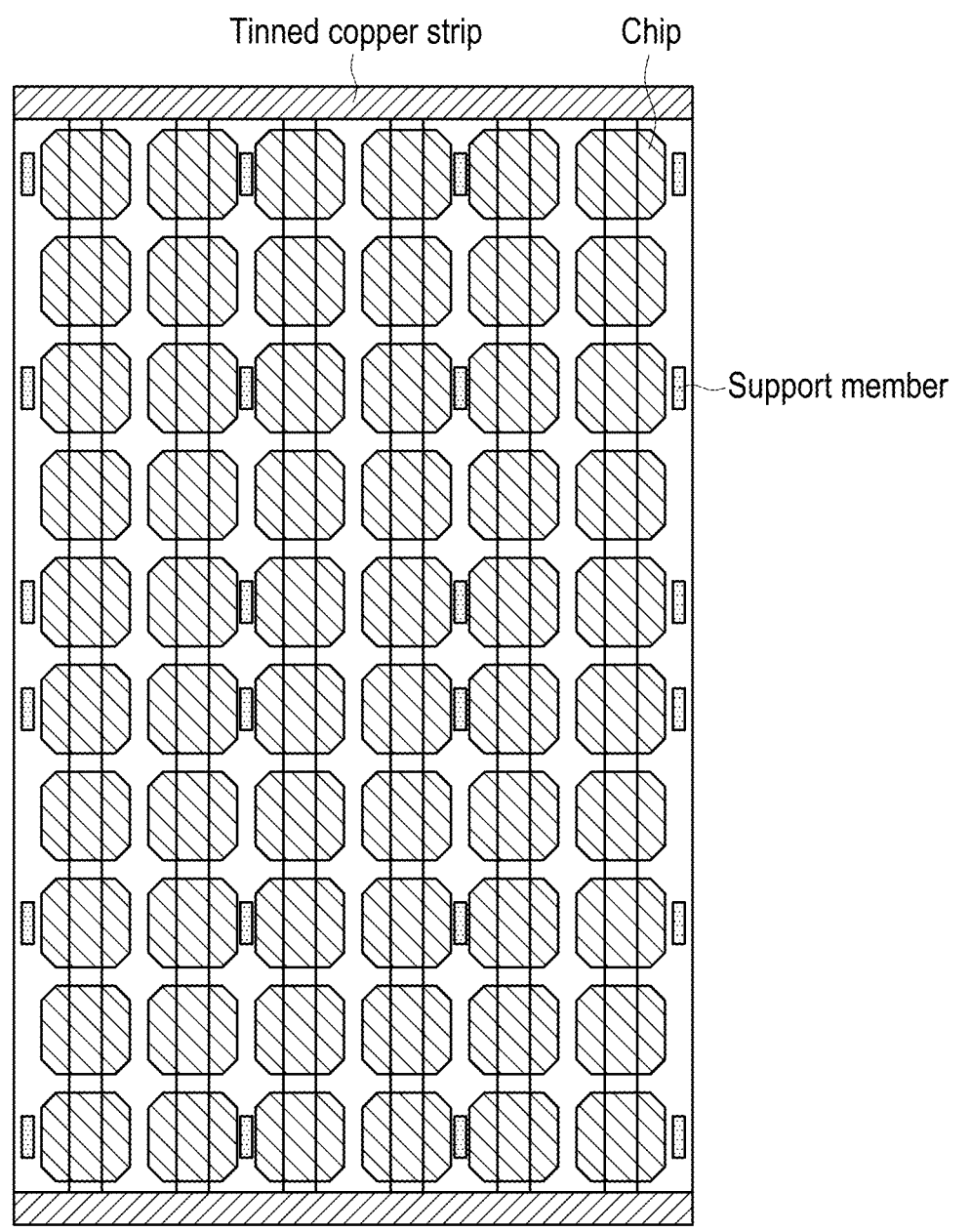
FIG. 8 is a plan view of the solar cell modules of Example 4 and Comparative example 3.
Figure 9:
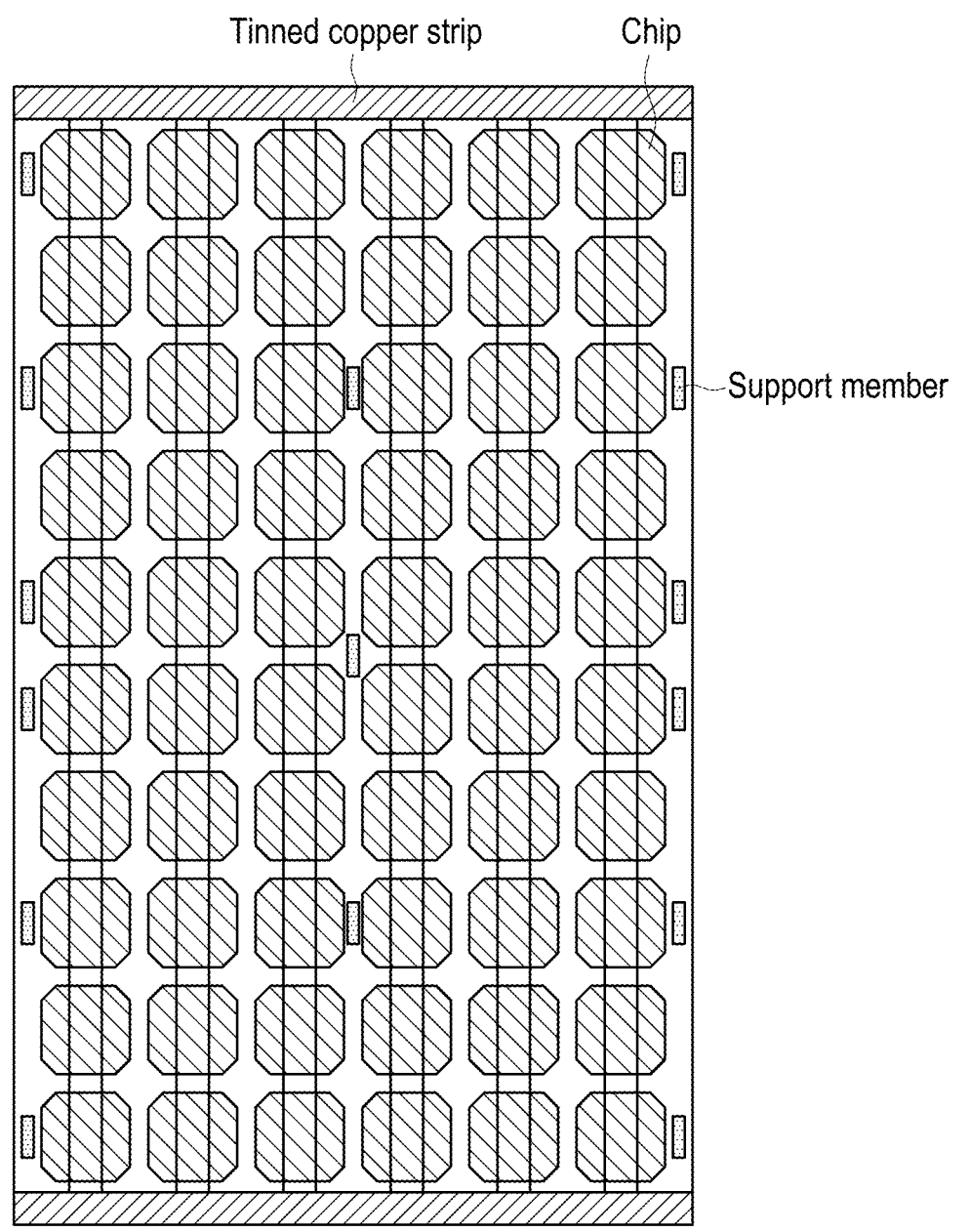
FIG. 9 is a plan view of the solar cell modules of Example 2, Example 3, and Comparative example 2.
Figure 10:
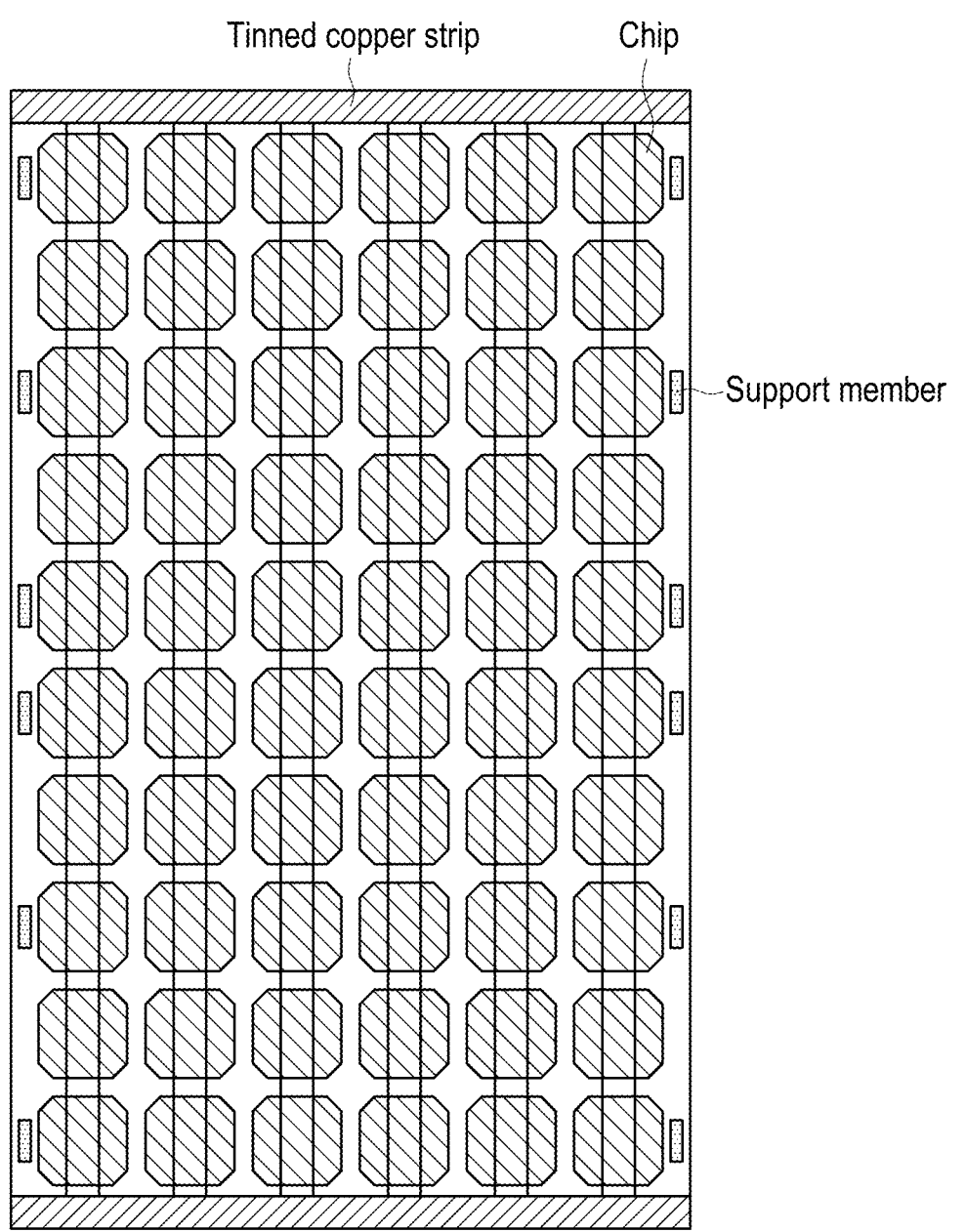
FIG. 10 is a plan view of the solar cell modules of Example 1 and Comparative example 1.

FIG. 8, FIG. 9, and FIG. 10 are schematic diagrams of the distribution pattern of support members in the solar cell modules of Examples 1 to 4 and Comparative example 3 respectively, wherein the support members of FIG. 8 were also disposed between any two rows of chips in the solar cell array; the support members of FIG. 9 were also disposed between the two central rows of chips in the solar cell array; the distribution pattern of the support members in FIG. 10 was the same as that in FIG. 5 of the simulation test in which the support members were disposed at two opposite sides of the module. In addition, in FIG. 8, FIG. 9. and FIG. 10, the tinned copper strips of the upper and lower ends and the bonding wires connected to the tinned copper strips are shown.

Comparative examples 1 to 2 also adopted the above steps, but adopted thermosetting resin instead of the double-layer structure.

3. Thermal Disassembly Test

The resulting solar cell modules were respectively placed flat in a high-temperature furnace cavity and baked at a temperature of 400° C. or more. After cooling down for 24 hours, whether the substrates of the solar cell modules were cracked was observed, and the fragmentation rate of the chips was calculated (=100%×(60 pieces−number of complete chips)/60 pieces). The results are also recited in Table 2 below.

TABLE 2

| | Example 1 | Example 2 | Example 3 | Example 4 | Comparative example 1 | Comparative example 2 | Comparative example 3 |
|---|---|---|---|---|---|---|---|
| Packaging film | Double-layer structure | Double-layer structure | Double-layer structure | Double-layer structure | Thermosetting resin | Thermosetting resin | Double-layer structure |
| Support member | C | C | A | A | C | C | B |
| Distribution pattern | FIG. 10 | FIG. 9 | FIG. 9 | FIG. 8 | FIG. 10 | FIG. 9 | FIG. 8 |
| Is the substrate cracked? | No cracks | No cracks | No cracks | No cracks | Upper and lower substrates cracked | Upper and lower substrates cracked | Hot pressing cracked |
| Complete chip (fragmentation rate) | 24 (60%) | 25 (58%) | 26 (57%) | 29 (52%) | 9 (85%) | 13 (78%) | — |

It may be obtained from Table 2 that if the substrate height in the experiment was less than 3 mm, the height or the diameter of the support members was 0.7 mm to 1.0 mm and the support members needed to be arranged at least at two opposite sides of the module, so as to significantly reduce fragmentation rate. If a double-layer structure containing a packaging film and a protective layer was also used, cracking to the substrate may be further prevented.

It will be apparent to those skilled in the art that various modifications and variations can be made to the structure of the disclosed embodiments without departing from the scope or spirit of the disclosure. In view of the foregoing, it is intended that the disclosure cover modifications and variations of this disclosure provided they fall within the scope of the following claims and their equivalents.

What is claimed is:

1. A solar cell module, comprising:

a first substrate;

a second substrate disposed opposite to the first substrate;

at least one cell unit disposed between the first substrate and the second substrate;

a first packaging film disposed between the at least one cell unit and the first substrate;

a second packaging film disposed between the at least one cell unit and the second substrate;

a first protective layer disposed between the at least one cell unit and the first packaging film;

a second protective layer disposed between the at least one cell unit and the second packaging film; and a plurality of support members disposed between the first packaging film and the second packaging film and surrounding at least two opposite sides of the at least one cell unit, wherein the plurality of support members are a ceramic material having a heat-resistant temperature greater than 400° C. and a coefficient of thermal expansion less than 10 ppm/° C.

2. The solar cell module of claim 1, wherein a quantity of the at least one cell unit is a plurality, and the plurality of cell units form a solar cell array.

3. The solar cell module of claim 2, wherein the plurality of support members are disposed at two opposite sides of the solar cell array.

4. The solar cell module of claim 2, wherein the plurality of support members are disposed between two rows of cell units in the solar cell array.

5. The solar cell module of claim 2, wherein a total length of the plurality of support members at an opposite side of the solar cell array accounts for 6% to 70% of a length of the opposite side.

6. The solar cell module of claim 3, wherein the plurality of support members are respectively disposed at a side of each of the cell units in the two opposite sides of the solar cell array and aligned with the corresponding cell units.

7. The solar cell module of claim 3, wherein the plurality of support members are respectively disposed at a side of a portion in the plurality of cell units in the two opposite sides of the solar cell array and aligned with the corresponding cell units.

8. The solar cell module of claim 3, wherein a portion in the plurality of support members is disposed at a top portion and a bottom portion of the two opposite sides of the solar cell array and aligned with the corresponding cell units, and remaining portions in the plurality of support members are dispersedly disposed at the two opposite sides of the solar cell array and spaced apart from each other by 1.5 to 2 times a length of the cell units.

9. The solar cell module of claim 1, wherein a spacing between the plurality of support members is 0.5 to 2 times a length of the cell unit.

10. The solar cell module of claim 1, wherein the plurality of support members comprise a cylinder, a cuboid, a hexagonal prism, or a sphere.

11. The solar cell module of claim 10, wherein the plurality of support members comprise a cylinder, and a diameter of the cylinder is less than a total thickness of the first packaging film and the second packaging film, and the diameter of the cylinder is greater than a height of the cell unit.

12. The solar cell module of claim 10, wherein the plurality of support members comprise a cuboid, and a height of the cuboid is less than a total thickness of the first packaging film and the second packaging film, and the height of the cuboid is greater than a height of the cell unit.

13. The solar cell module of claim 1, wherein a material of the plurality of support members comprises a low-temperature co-fired ceramic.

14. The solar cell module of claim 1, wherein the first packaging film and the second packaging film comprise a thermosetting resin.

15. The solar cell module of claim 1, wherein the first protective layer and the second protective layer comprise a thermoplastic resin or a partially cross-linked polymer.

\* \* \* \* \*